United States Patent [19]

Twigg et al.

[11] Patent Number: 5,647,756

[45] Date of Patent: Jul. 15, 1997

[54] INTEGRATED CIRCUIT TEST SOCKET HAVING TOGGLE CLAMP LID

[75] Inventors: Richard Dean Twigg, Columbia; Steven Dale Mitchem, Jefferson City, both of Mo.

[73] Assignee: Minnesota Mining and Manufacturing, Saint Paul, Minn.

[21] Appl. No.: 574,770

[22] Filed: Dec. 19, 1995

[51] Int. Cl.[6] .................................................. H01R 13/62
[52] U.S. Cl. ........................................... 439/331; 439/73
[58] Field of Search ............................. 439/73, 330, 331

[56] References Cited

U.S. PATENT DOCUMENTS

| | | | |
|---|---|---|---|
| 4,456,318 | 6/1984 | Shibata et al. | 439/331 |
| 4,554,505 | 11/1985 | Zachry | 439/71 |
| 5,176,524 | 1/1993 | Mizuno et al. | 439/73 |
| 5,247,250 | 9/1993 | Rios | 324/158 F |
| 5,308,256 | 5/1994 | Tonooka et al. | 439/266 |
| 5,320,551 | 6/1994 | Mori et al. | 439/266 |
| 5,364,284 | 11/1994 | Tohyama et al. | 439/266 |

FOREIGN PATENT DOCUMENTS

| | | |
|---|---|---|
| 0 613 335 A1 | 2/1994 | European Pat. Off. . |
| 0 622 982 A1 | 4/1994 | European Pat. Off. . |
| 62-076274 | 4/1987 | Japan . |
| 62-076273 | 4/1987 | Japan . |

*Primary Examiner*—Neil Abrams
*Assistant Examiner*—T. C. Patel
*Attorney, Agent, or Firm*—Gary L. Griswold; Walter N. Kirn; Matthew B. McNutt

[57] ABSTRACT

A test socket for integrated circuits includes a lid having a pressure pad which may move independently of the lid. The pressure pad is operated by a lever creating a large mechanical advantage and is provided to apply a large normal force to an integrated circuit in the test socket after the lid is closed to ensure good electrical contact between the integrated circuit device and the contact pins of the test socket.

4 Claims, 4 Drawing Sheets

INTEGRATED CIRCUIT TEST SOCKET HAVING TOGGLE CLAMP LID

FIELD OF THE INVENTION

The present invention pertains generally to devices that test integrated circuits, and more particularly to an improved test socket which is capable of making, on a repetitive basis, reliable connections between the leads of an integrated circuit and the test socket's contact pins.

BACKGROUND OF THE INVENTION

Critical integrated circuits are tested at elevated temperatures before being installed in a product because it has been found that a vast majority of these circuits, if prone to failure, will fail in a very short test period. These integrated circuits are frequently encapsulated in rectangular ceramic or plastic packages that have contact pads or leads, which pads or leads are electrically connected to the integrated circuit. To test the integrated circuit it is necessary to make temporary electrical connections to the contact pads or leads on the integrated circuit package. Test sockets which may be soldered to printed circuit boards having the appropriate circuitry for testing a particular integrated circuit have been provided for this purpose.

Most prior designs include a lid which is hinged to the test socket base along one edge which is intended to clamp the integrated circuit down onto the contact pins of the test socket as the lid is closed. One such socket is illustrated in U.S. Pat. No. 5,247,250, which is assigned to the assignee of the present invention and incorporated herein by reference.

If the number of leads of the integrated circuit device is great, the combined spring force generated by the socket contacts becomes large and a great deal of force must be applied to the lid to latch it. It would be desirable to provide some means of obtaining a mechanical advantage in forcing the integrated circuit device downwardly into contact with the contact pins of the test socket.

SUMMARY OF THE INVENTION

The present invention overcomes the limitations of the socket of U.S. Pat. No. 5,247,250 by providing a socket lid having a movable central pressure pad operated by a lever and toggle linkage independently of the position of the lid. The lid may thus be closed over the integrated circuit device and latched without substantially any force being applied to the device. The lever may then be operated to move the pressure pad downwardly toward the integrated circuit device by means of the linkage and force the device into contact with the contact pins of the test socket.

BRIEF DESCRIPTION OF THE DRAWINGS

The present invention will be more particularly described with reference to the accompanying drawings, wherein like numbers refer to like parts in the several views, and wherein.

DETAILED DESCRIPTION OF THE PREFERRED EMBODIMENT

Figure 1:
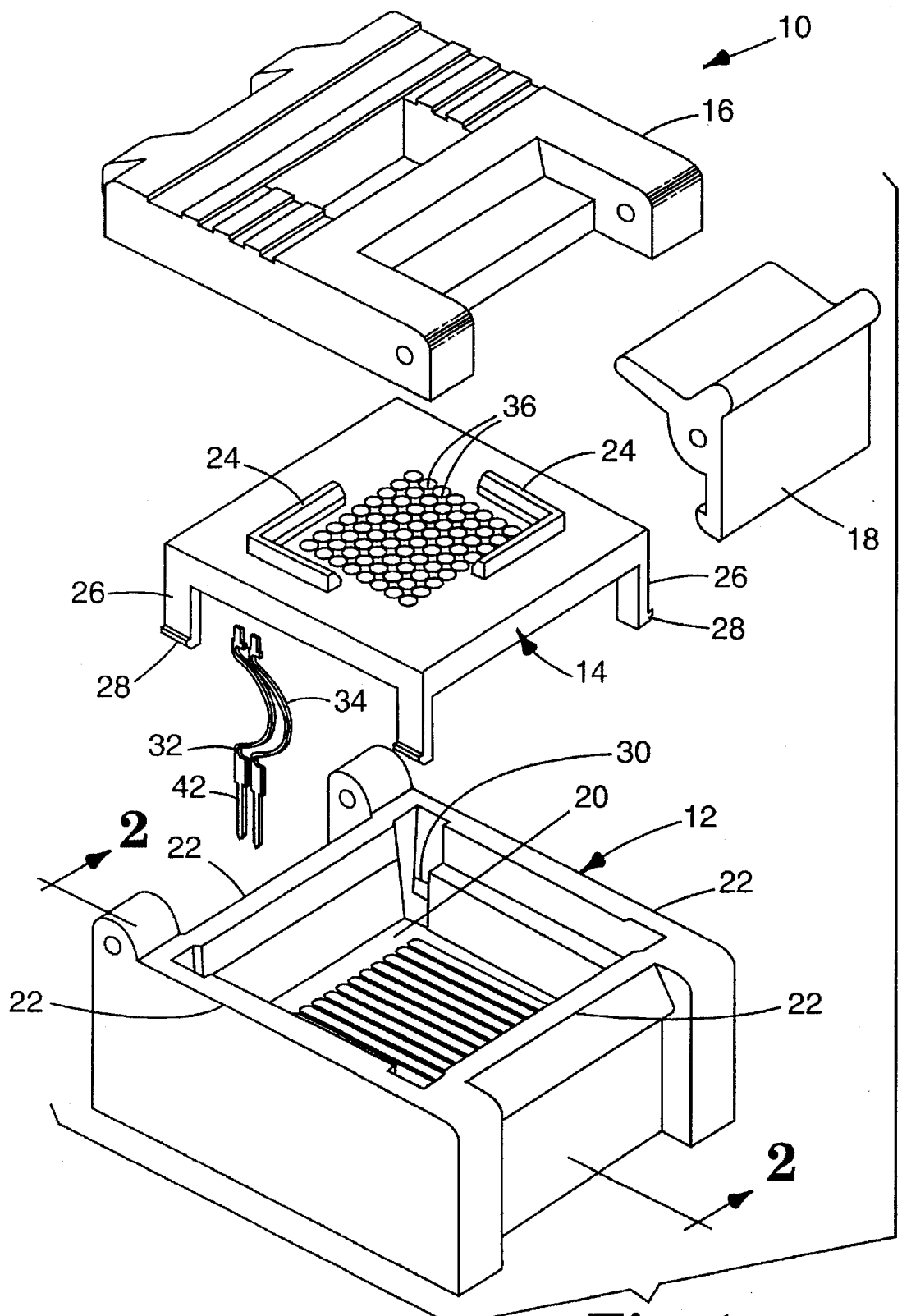
FIG. 1 is an exploded, perspective view of the components of a prior test socket according to U.S. Pat. No. 5,247,250.

FIG. 1 illustrates a test socket, generally indicated as 10, according to the teachings of U.S. Pat. No. 5,247,250 which includes a base 12, a platform 14 for supporting an integrated circuit, a cover 16 which retains the integrated circuit in contact with the platform 14 and a latch 18 which secures the cover 16 to the base 12 and maintains the integrated circuit in contact with the platform 14. The base 12 is comprised of a generally flat lower surface 20 from which extend upwardly four walls 22 to define an open interior space.

The platform 14 is generally square in shape and includes two raised alignment ridges 24 which define a nest for an integrated circuit (not shown in FIG. 1). Extending from the flat portion of the platform 14 are four legs 26 which terminate in outwardly projecting ends 28 which engage recesses 30 in the base walls 22. This engagement between the platform leg ends 28 and the base recesses 30 acts to prevent the platform 14 from moving in a direction away from the lower surface 20 of the base 12 but the recesses 30 extend for a substantial distance toward the lower surface 20 of the base 12 and thus permit any or all of the legs 26, and the platform 14, to move toward the lower surface 20 of the base 12. The platform 14 is thus free to "float" relative to the base 12, that is, any portion of the platform 14 may be depressed relative to the base 12 independently of any other portion of the platform 14. Thus the platform 14 is free to tilt in any direction in response to forces which are unevenly applied to the integrated circuit. This motion of the platform 14 is more fully described in U.S. Pat. No. 5,247,250.

The platform 14 is supported above the lower surface 20 of the base 12 by contact pins 32. The contact pins 32 are manufactured of a resilient, electrically conductive metal such as copper and are formed with a bowed central portion 34 to provide the contact pins 32 with a spring action. The contact pins 32 extend through slots or holes 36 in the platform 14 to contact solder balls formed on the integrated circuit. The ends of the contact pins 32 opposite the integrated circuit are formed as blades 42 which extend through the lower surface 20 of the base 12 for electrical connection to holes in a circuit board (not shown) to which the test socket 10 is to be attached. The contact pins 32 are retained relative to the platform 14 and the base 12 by shoulders fitting within enlarged slots or counterbores formed in both the base 12 and the platform 14.

Figure 2:
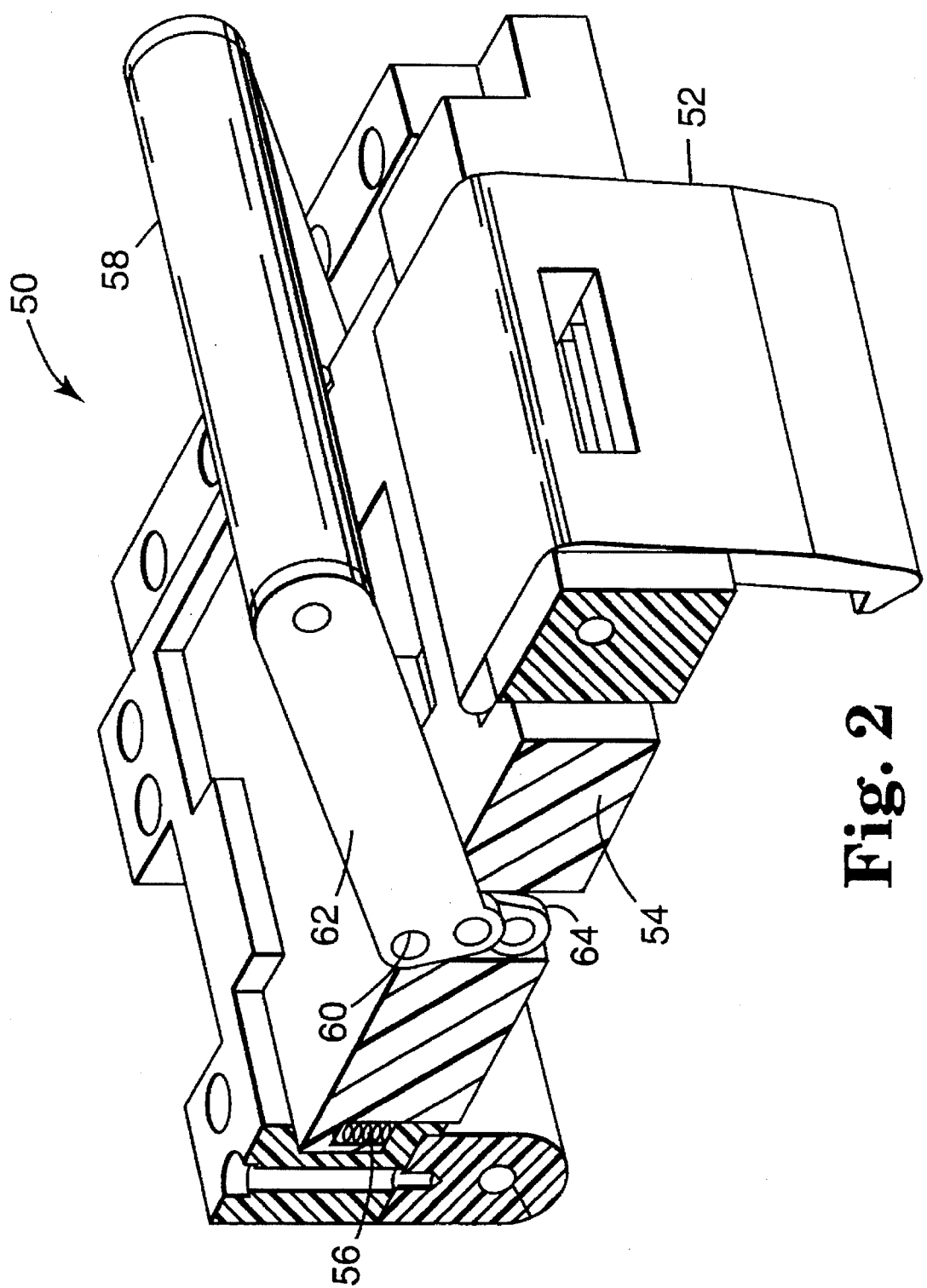
FIG. 2 is a perspective, cross-sectional view of the lid of the present invention.
Figure 3:
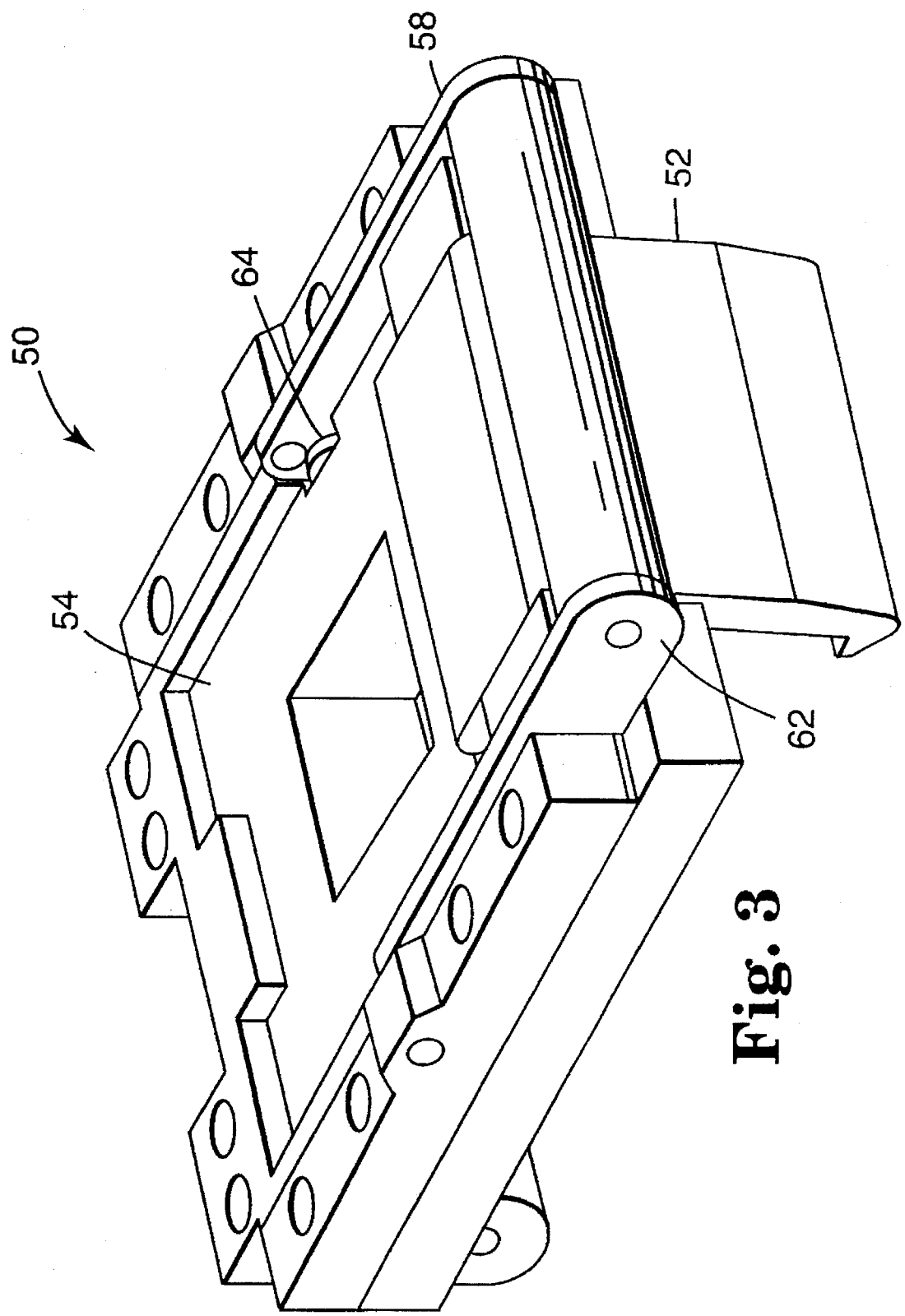
FIG. 3 is a perspective view of a test socket lid of the present invention.
Figure 4:
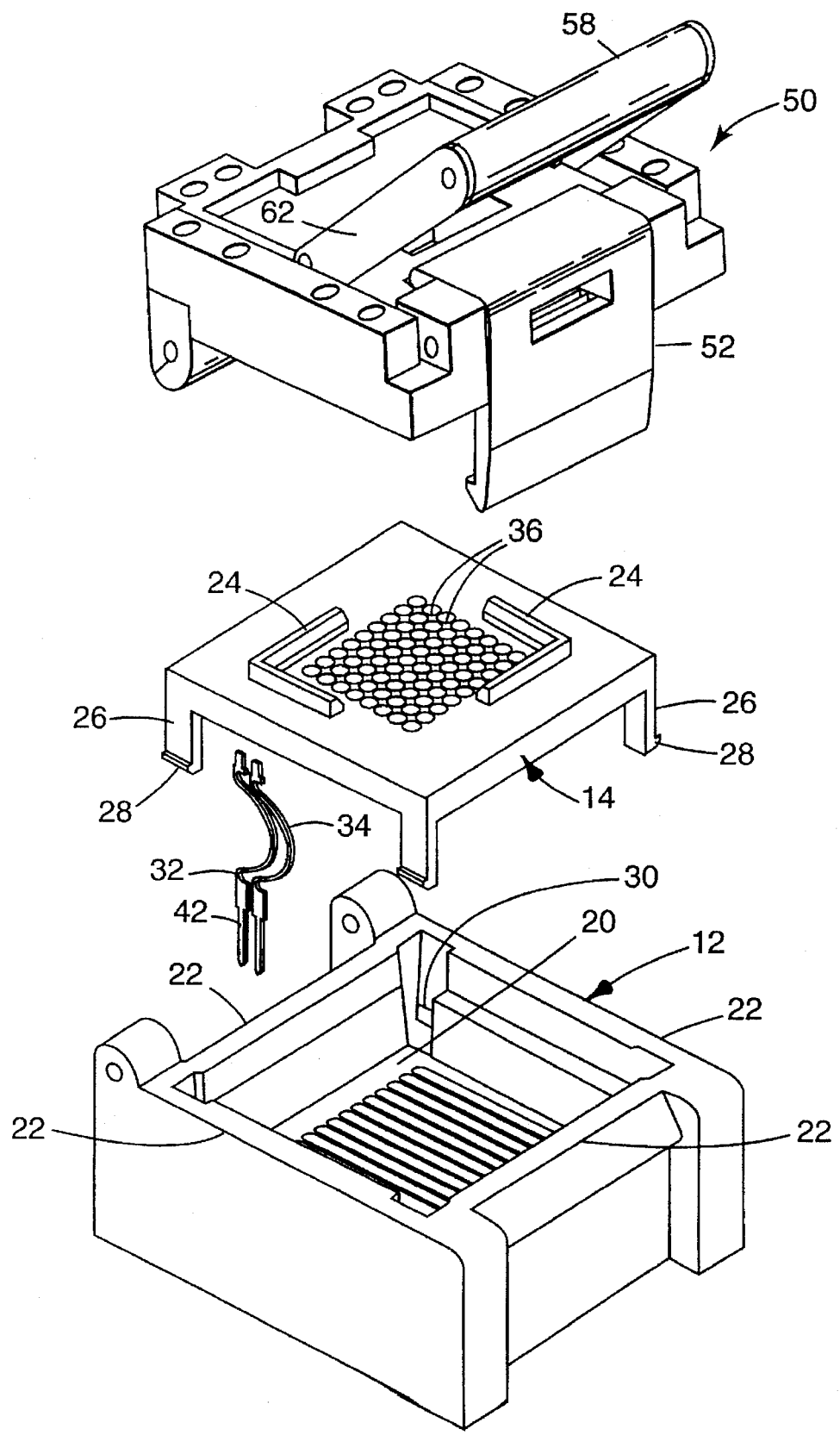
FIG. 4 is an exploded, perspective view of the component of the present invention.

With reference to FIGS. 2 and 3, an improved lid 50 is shown which may be used in place of the lid 16 shown in FIG. 1. The lid 50 has a latch 52 substantially identical to the latch 18 and a central pressure pad 54 sized to cover the integrated circuit device to be tested. The pressure pad 54 is biased upwardly, as seen from the perspectives of FIGS. 2 and 3, by four springs 56 positioned at the corners of the pressure pad 54 between the body of the lid 50 and the pressure pad 54.

The pressure pad 54 is operated by a lever 58 pivotally mounted to the lid 50 at holes 60 disposed in the arms 62 of the lever 58. The lever 58 is also pivotally connected to links 64 which are in turn pivotally connected to the pressure pad 54. FIG. 2 illustrates the pressure pad 54 and the lever in the open position wherein the links 64 are drawn upwardly and so raise the pressure pad 54. FIG. 3 illustrates the lever 58 and the pressure pad 54 in the closed position wherein the links 64 and thus the pressure pad 54 have been forced downwardly by rotation of the lever 58 about its pivot hole 60. The length of the arms 62 relative to the distance between the connection of the arms 62 to the lid 50 and the connection of the arms 62 to the links 64 results in a great mechanical advantage which can generate a large downward force on the integrated circuit device.

In operation, the lever 58 is left in the open position shown in FIG. 2 and the pressure pad is forced upwardly by the springs 56. After the integrated circuit device is inserted into the test socket, the lid 50 is closed and the latch 52 secured. The lever 58 is then pushed downwardly to the position shown in FIG. 3, forcing the links 64 and the pressure pad 54 downwardly in the process. This action forces the leads of the integrated circuit device into contact with the contact pins 32 of the test socket 10 and accomplishes the required electrical connections.

The advantages of the lever 58 and its actuation of the pressure pad 54 are the mechanical advantage described above, the fact that the entire upper surface of the integrated circuit device is contacted before force is applied and that force on the integrated circuit device is applied in a direction which is normal to the plane of the device. This is contrasted to the operation of the lid 16 of the prior test socket 10 which necessarily applied force to one edge of the integrated circuit device first since the lid 16 pivoted around a hinge connection to the body 22 of the test socket 10. If a large clamping force was required, this unequal application of force to the device could result in breakage.

The present invention has been described with respect to only a single embodiment, but many modifications will be apparent to those skilled in the art. For example, the pressure pad 54 could have a shape other than square and could cover larger or smaller areas than illustrated. Springs other than the helical type shown could be used to bias the pressure pad. The lever 58 could simply bear against a cam surface to force the pressure pad, although this is not a desirable design since frictional forces would partially offset the mechanical advantage gains produced by the lever 58. Finally, and most generally, the lid of the invention could be used with a wide variety of test socket bodies other than the one illustrated.

The invention claimed is:

1. An improved test socket for integrated circuits of the type including:

a base;

a platform supporting said integrated circuit;

resilient contacts extending at least partially into said platform for electrical connection to said integrated circuit; and a lid pivotally connected to said base and including a latch for securing said lid relative to said base; the improvement comprising:

a pressure pad forming a portion of said lid, said pressure pad being slidably moveable with respect to said lid;

a lever pivotally attached to said lid and moveable between a closed position and an open position; and means connecting said lever and said pressure pad for forcing said pressure pad toward said base when said lid is closed and said lever is moved from said open position to said closed position.

2. A test socket according to claim 1 further including springs for biasing said pressure pad away from said base when said lid is in said closed position.

3. A test socket according to claim 1 wherein said means connecting said lever and said pressure pad is at least one link pivotally connected to said lever and said pressure pad.

4. A test socket according to claim 1 further including a latch for retaining said cover in contact with said integrated circuit.

* * * * *